US011031507B2

(12) United States Patent
Dahl et al.

(10) Patent No.: US 11,031,507 B2
(45) Date of Patent: Jun. 8, 2021

(54) SEMICONDUCTOR DEVICE AND METHOD OF MANUFACTURE

(71) Applicant: Comptek Solutions Oy, Turku (FI)

(72) Inventors: Johnny Dahl, Turku (FI); Vicente Calvo Alonso, Piispanristi (FI); Jouko Lang, Lieto (FI)

(73) Assignee: Comptek Solutions Oy, Turku (FI)

( * ) Notice: Subject to any disclaimer, the term of this patent is extended or adjusted under 35 U.S.C. 154(b) by 3 days.

(21) Appl. No.: 16/634,628

(22) PCT Filed: Jul. 27, 2018

(86) PCT No.: PCT/FI2018/050556
§ 371 (c)(1),
(2) Date: Jan. 28, 2020

(87) PCT Pub. No.: WO2019/020869
PCT Pub. Date: Jan. 31, 2019

(65) Prior Publication Data
US 2021/0091231 A1 Mar. 25, 2021

(30) Foreign Application Priority Data
Jul. 28, 2017 (GB) ..................................... 1712150

(51) Int. Cl.
*H01L 21/02* (2006.01)
*H01L 29/786* (2006.01)

(52) U.S. Cl.
CPC .. *H01L 29/78696* (2013.01); *H01L 21/02233* (2013.01); *H01L 21/02488* (2013.01); *H01L 29/7869* (2013.01)

(58) Field of Classification Search
CPC .......... H01L 29/78696; H01L 29/7869; H01L 21/02233; H01L 21/02488
(Continued)

(56) References Cited

U.S. PATENT DOCUMENTS 5,909,614 A 6/1999 Krivoshlykov
5,965,908 A 10/1999 Shibata et al.
(Continued)

FOREIGN PATENT DOCUMENTS

DE 102015117874 A1 4/2017
JP H09320967 A 12/1997
WO 2012062966 A1 5/2012

OTHER PUBLICATIONS

Punkkinen et al., "Oxidized In-containing III-V (100) Surfaces: Formation of Crystalline Oxide Films and Semiconductor-oxide Interfaces," Physical Review B 83, 195329 (2011).
(Continued)

*Primary Examiner* — Tong-Ho Kim
(74) *Attorney, Agent, or Firm* — James C. Lydon

(57) ABSTRACT

Disclosed is a semiconductor device and a method of manufacturing the said semiconductor device. The semiconductor device comprises a plurality of layers. The method of fabricating the semiconductor device comprises obtaining a substrate layer, arranging a first corresponding crystalline terminating oxide layer on the substrate layer, arranging at least one semiconductor layer on the first crystalline terminating oxide layer, arranging a second corresponding crystalline terminating oxide layer on the at least one semiconductor layer, and arranging an electrical insulating layer on the second crystalline terminating oxide layer.

13 Claims, 7 Drawing Sheets

(58) Field of Classification Search
USPC .......................................................... 257/43
See application file for complete search history.

(56) References Cited

U.S. PATENT DOCUMENTS

| | | | |
|---|---|---|---|
| 9,269,763 B2* | 2/2016 | Laukkanen | ........... H01L 29/205 |
| 9,837,486 B2 | 12/2017 | Laukkanen et al. | |
| 10,256,290 B2 | 4/2019 | Laukkanen et al. | |
| 2012/0061728 A1* | 3/2012 | Javey | ................ H01L 29/78681 |
| | | | 257/192 |
| 2014/0353771 A1 | 12/2014 | Wang et al. | |
| 2015/0060873 A1 | 3/2015 | Chiu et al. | |
| 2016/0351698 A1 | 12/2016 | Yang | |
| 2017/0104083 A1 | 4/2017 | Chiu et al. | |
| 2018/0218901 A1 | 8/2018 | Kuzmin et al. | |

OTHER PUBLICATIONS

Qin et al., "A Crystalline Oxide Passivation for Al2O3/AlGaN/GaN," Applied Physics Letters, 105, 141604 (2014).

* cited by examiner

502

504

SEMICONDUCTOR DEVICE AND METHOD OF MANUFACTURE

TECHNICAL FIELD

The present disclosure relates generally to semiconductor devices; and more specifically to compound semiconductors fabricated onto insulators (XOI). Moreover, the present disclosure relates to methods of manufacturing aforesaid semiconductor devices. Furthermore, the present disclosure relates to computer program products comprising a non-transitory computer-readable storage medium having computer-readable instructions stored thereon, the computer-readable instructions being executable by a computerized device comprising processing hardware to execute aforesaid methods.

BACKGROUND

Compound semiconductor devices which are composed of elements of at least two different species are well known structures. In comparison with elemental silicon, compound semiconductors provide some advantages. For example, gallium arsenide (GaAs) has six times higher electron mobility than silicon, which allows for faster operation; wider band gap, which allows operation of power devices at higher temperatures; and its direct band gap gives it more favourable optoelectronic properties than the indirect band gap of silicon, among other advantages. Such compound semiconductor devices, particularly heterostructures that are epitaxially fabricated in III-V semiconductors, are employed in optoelectronic devices, such as lasers and light emitting diodes, detectors or photovoltaic devices, e.g. solar cells, etc.

Furthermore, in semiconductor technology, there has been a transition from bulk silicon structures to Silicon-on-Insulator (SOI) structures, which refers to the use of a layered silicon-insulator-silicon substrate in place of conventional silicon substrates. These SOI structures provide many benefits, such as a reduced parasitic capacitance and reduced leakage currents; and therefore have some advantageous applications, for example high-frequency digital and analogue devices. These SOI semiconductor structures find its use especially in high performance radio frequency (RF) applications. Similar, compound semiconductor on Insulator (XOI) structures, such as compound semiconductors heterogeneously integrated on silicon (Si) substrates have been recognised to combine the high mobility of III-V semiconductors and the well-established low-cost processing of Si technology.

However, for compound semiconductors, it has not been hitherto possible to realize a feasible method of fabricating compound semiconductor on Insulator (XOI) structures. One main problem encountered is a high conductivity of an interface of a given compound semiconductor with its corresponding insulator. For example, hetero-epitaxial growth of complex multilayers of compound semiconductors on silicon (Si) provides challenges; including adverse effects, such as reaction of the substrates with their associated insulators, besides high defect densities and junction leakage currents. Such adverse effects can arise due to crystal lattice mismatch between the substrate and its associated insulator, resulting in crystalline lattice defects that function as recombination sites for charge carriers and/or reduce a mobility of such charge carriers within a given compound semiconductor device.

Conventionally, compound semiconductor substrates undergo some passivation treatment to reduce adverse effects of a reaction of the substrates with their associated insulators. This treatment can be, for example, including but not limited to, a chemical sulphur passivation or be a self-cleaning effect of an atomic layer deposition (ALD) based growth treatment. However, these known methods either cannot provide a sufficient quality epitaxial stack structure, or are not viable for mass production of compound semiconductor devices. Moreover, epitaxial stacks that are contemporarily considered to be used in XOI structures are not suitable for semiconductor device applications, because when growing an insulator on a compound semiconductor substrate, the substrate reacts with the molecules of the insulator and this creates electronic defect states in the interface.

Therefore, in light of the foregoing discussion, there exists a need to overcome the aforementioned drawbacks associated with conventional semiconductor devices and conventional manufacturing techniques, and to realize a feasible method of fabricating compound semiconductor on Insulator (XOI) structures.

SUMMARY OF THE INVENTION

The present disclosure seeks to provide a semiconductor device. The present disclosure also seeks to provide a method of fabricating a semiconductor device. An aim of the present disclosure is to provide a solution that overcomes at least partially the problems encountered in prior art, and provides a reliable method for fabricating a compound semiconductor on insulator (XOI) structure device by employing crystalline terminating oxide layers for epitaxial growth of highly ordered compound semiconductor layers on electrical insulating layers.

In one aspect, an embodiment of the present disclosure provides a semiconductor device comprising a plurality of layers, wherein it comprises, in order
 a first corresponding crystalline terminating oxide layer,
 at least one III-V compound semiconductor layer,
 a second corresponding crystalline terminating oxide layer, and
 an electrical insulating layer.

In another aspect, an embodiment of the present disclosure provides a method of fabricating a semiconductor device comprising a plurality of layers, the method comprising
 obtaining a substrate layer,
 arranging a first corresponding crystalline terminating oxide layer on the substrate layer,
 arranging at least one III-V compound semiconductor layer on the first crystalline terminating oxide layer,
 arranging a second corresponding crystalline terminating oxide layer on the at least one semiconductor layer, and
 arranging an electrical insulating layer on the second crystalline terminating oxide layer.

In yet another aspect, embodiments of the present disclosure provide a computer program product comprising a non-transitory (namely non-transient) computer-readable storage medium having computer-readable instructions stored thereon, the computer-readable instructions being executable by a computerized device comprising processing hardware to execute the aforementioned method of fabricating a semiconductor device.

Embodiments of the present disclosure substantially eliminate or at least partially address the aforementioned problems in the conventional techniques, and provides for growth of thin, highly ordered crystalline terminating oxide layers to enable epitaxial growth of crystalline compound semiconductor on insulator devices.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure not limited to specific methods and apparatus disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

Figure 1:
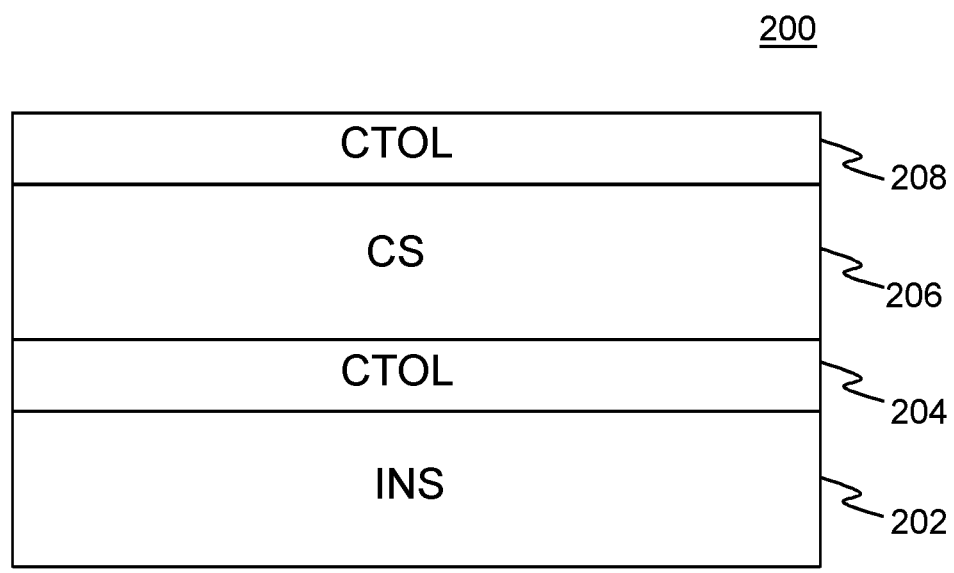
FIG. 1 is a schematic illustration of the cross-section of the semiconductor device having an electrical insulating layer and a corresponding crystalline terminating oxide layer therein, in accordance with another embodiment of the present disclosure.

In the accompanying diagrams, an underlined number is employed to represent an item over which the underlined number is positioned or an item to which the underlined number is adjacent. A non-underlined number relates to an item identified by a line linking the non-underlined number to the item.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

In one aspect, an embodiment of the present disclosure provides semiconductor device comprising a plurality of layers, comprising, in order
  a first corresponding crystalline terminating oxide layer,
  at least one III-V compound semiconductor layer,
  a second corresponding crystalline terminating oxide layer, and
  an electrical insulating layer.

In another aspect, an embodiment of the present disclosure provides a method of fabricating a semiconductor device comprising a plurality of layers, the method comprising
  obtaining a substrate layer,
  arranging a first corresponding crystalline terminating oxide layer on the substrate layer,
  arranging at least one III-V compound semiconductor layer on the first crystalline terminating oxide layer,
  arranging a second corresponding crystalline terminating oxide layer on the at least one semiconductor layer, and
  arranging an electrical insulating layer on the second crystalline terminating oxide layer.

The present disclosure provides a semiconductor device and a method of fabricating the semiconductor device. According to an embodiment, the semiconductor device of the present disclosure is implemented as a compound semiconductor on insulator (XOI) structure. Herein, "X" represents a compound semiconductor substrate. The structure of the present semiconductor device can be differentiated from a conventional silicon on insulator (SOI) structure in the respect that the present semiconductor device employs a compound semiconductor substrate instead of elemental silicon substrate as the semiconductor layer interfacing with an electrical insulating layer. The structure of the present semiconductor device can also be differentiated from a conventional crystalline oxide containing heterostructure in that the present semiconductor device employs crystalline terminating oxides which are fabricated in an oxygen induced surface transformation process.

The semiconductor device may comprise a substrate layer onto which the multiple layers of the semiconductor device may be grown, i.e. in the method, a substrate layer is typically used, but it may no longer be present in the end-product. In an embodiment, the substrate layer can contain an electrical insulating layer. Specifically, the substrate layer can contain a layer composed of silicon dioxide ($SiO_2$). However, the substrate layer may be composed of sapphire, and these types of semiconductor devices are also known as silicon on sapphire (or SOS). The choice of substrate layer (or the insulator) is largely dependent on intended application, with sapphire being used for high-performance radio frequency (RF) and radiation-sensitive applications, and silicon dioxide for diminished short channel effects in microelectronics devices.

The semiconductor device further comprises at least one semiconductor layer. In one example, the semiconductor layer is grown on top of the substrate layer. In an embodiment, the semiconductor layer, used in the semiconductor device, is a compound semiconductor substrate layer At least one, of the semiconductor layers is fabricated from III-V semiconductor materials. The compound semiconductor materials may be inorganic. In one example, the aforementioned III-V compound semiconductor substrate may include materials, such as gallium nitride or the like. In other examples, the compound semiconductor substrate material used may include InAs, GaSb, GaAs, InSb, InP, ternary compound semiconductors, quaternary compound semiconductors, quinary compound semiconductors or the like.

The layers listed above are arranged in the order given, but this does not exclude further layers in between the listed layers. For example, there could be a further electrical insulating layer or a semiconductor layer on the first corresponding crystalline terminating oxide layer on an opposing side from the at least one III-V compound semiconductor layer. There could also be three crystalline terminating oxide layers in the device, for example if there were two semiconductor layers, optionally separated by a crystalline terminating oxide layer. The device could also comprise a substrate layer. The same applies to the method, where additional steps can be incorporated in between the steps listed above.

In an embodiment, the compound semiconductor layer is grown in the semiconductor device using known epitaxial methods. The layers, thereby, deposited or grown typically contain a multitude of different epitaxial semiconductor materials. The known common methods to grow such compound semiconductor layer include, but not limited to, molecular beam epitaxy (MBE), chemical vapour deposition (CVD), plasma enhanced chemical vapour deposition (PECVD) and metal organic chemical vapour deposition (MOCVD). In an example, the semiconductor device may include multiple semiconductor layers therein. According to an embodiment, at least one of the semiconductor layers is operable to provide a conduction path for an electrical signal, and the conduction path has charge carriers whose density in operation is controlled by an applied electric field. Therefore, the semiconductor device of the present disclosure is suitable for Field-Effect Transistor (FET) applications.

In an embodiment, the semiconductor device further comprises one or more crystalline terminating oxide layers that provide interfaces between the compound semiconductor layers and the substrate layers, i.e. the electrical insulating layers, therein. Hereinafter, the terms "terminating oxide layer" have been used in place of "crystalline terminating oxide layer", without any limitations. In an example, the semiconductor device comprises multiple crystalline terminating oxide layers, for example a first crystalline terminating oxide layer and a second crystalline terminating oxide layer disposed on both sides of the semiconductor layer, from its one side; and may be in contact with electrically insulating layers on its other side.

In one embodiment, the crystalline terminating oxide layer, in the semiconductor device, is implemented as a buried layer. The crystalline terminating oxide layer as buried layer can confine current to a specified area of the semiconductor device, by using an insulating material inside of the buried layer or by leaving a created void within the material. Such buried layer is useful in the construction of a semiconductor Vertical Cavity Laser (VCL). The crystalline terminating oxide layers, as formed, are resistant to air exposure and therefore retain crystallinity even with exposure to ambient air. This can circumvent contemporarily known problems of formation of low quality surface after exposure of a compound semiconductor wafer to ambient air pressure. Furthermore, these crystalline terminating oxide layers are synergistically capable of defining energy barriers in stacks of semiconductor layers for achieving improved electron confinement in the semiconductor device.

According to an embodiment, the method of fabricating the semiconductor device comprises fabricating the semiconductor device as a heterostructure by using epitaxial fabrication processes. The term "epitaxy" described herein, refers to the deposition of a crystalline layer over a crystalline substrate. The growth of the semiconductor device may be facilitated by using a semiconductor heterostructure where one or more crystalline terminating oxide layers are incorporated. Such thin, yet highly ordered, crystalline terminating oxide layers exhibit excellent uniformity with smooth surface structures which allows use of such layers as templates for subsequent semiconductor epitaxy to be performed there onto. After semiconductor epitaxy on the crystalline terminating oxide layer, the semiconductor can be transformed into a crystalline terminating oxide, thus creating a thicker crystalline terminating oxide. The process may be repeated a required number of times as per the design, till the desired thickness of the crystalline terminating oxide layer is achieved. It will be appreciated that embodiments of the present disclosure employ one or more crystalline terminating oxide layer structures as a platform when performing semiconductor crystal regrowth.

In an embodiment, the crystalline terminating oxide layer is formed by an oxidation treatment process. The crystalline terminating oxide layer may be manufactured by employing an oxygen dosage in vacuum conditions. The aforementioned crystalline terminating oxide layer is fabricated by administering oxygen (as gaseous form, as $O_2$ or $O_3$, or for example with $H_2O_2$ being present) to a surface of a semiconductor substrate material. Typically, only oxygen is used as a reagent, as compared to the traditional oxide layer formation processes which typically involves using more than one element reaction. The oxygen is absorbed into a crystalline lattice of a semiconductor material layer without causing any oxide growth deposition to occur onto the semiconductor material layer, i.e, to transform the surface of the first semiconductor layer to a terminating oxide layer. It will be appreciated that the crystalline terminating oxide layer is formed by transformation of the substrate semiconductor material surface. The structure of the crystalline terminating oxide layer is material dependent and structures correspond to different III-V semiconductor materials. Examples of such treatments and corresponding crystalline terminating oxide structures are given in Punkkinen et al., Physical Review B 83, 195329 (2011), Qin et al., Applied Physics Letters 105, 141604 (2014) and in the publication WO 2012/062966. For example, the (3×1)-O structure of the crystalline terminating oxide corresponds to InAs and InGaAs materials. As another example, the (2×3)-O structure of the crystalline terminating oxide corresponds to InP material. In an embodiment where the III-V material is InAs, the corresponding crystalline terminating oxide layers can be at least such crystalline terminating oxide layers which have a surface symmetry of c(4×2) and (3×1). In an embodiment where the III-V material is InGaAs, the corresponding crystalline terminating oxide layers can be at least such crystalline terminating oxide layers which have a surface symmetry of c(4×2), (4×3), (3×1) and (3×2). In an embodiment where the III-V material is InP, the corresponding crystalline terminating oxide layers can be at least such crystalline terminating oxide layers which have a surface symmetry of (2×3). Further possible III-V materials and their corresponding crystalline terminating oxide layer (given in parentheses) are for example GaN ($3\sqrt{3}\times3\sqrt{3}$-R30°), AlGaN (1×1), InSb (1×2), InGaSb (1×2), InAs (3×3), InGaAs (3×3), InP (1×1) and InGaP (1×1).

The same possibilities concerning the crystalline terminating oxide layer concern the other possible crystalline terminating oxide layers of the semiconductor device.

In an example, an external surface of the semiconductor layer is heated to a temperature of at least 200° C. and up to 550° C. for supporting the oxidation process. The temperature is selected depending upon a material composition of the external surface. The reaction takes place in vacuum conditions, with the chamber background pressure in range of $1\times10^{-11}$ to $1\times10^{-7}$ mBar. Subsequently, the external surface is exposed to a dosage of oxygen atoms at the selected temperature. In an embodiment, the oxygen dosage is selected to be low enough such that oxygen atoms of the oxygen dosage can adsorb and diffuse into the semiconductor layer without creating an amorphous structure on its external surface. The aforementioned relatively low oxygen dosage is achieved in practice, for example by having an oxygen gas with partial pressure of less than $1\times10^{-7}$ to $1\times10^{-2}$ mBar in a vacuum chamber, which is comparatively much lower than pressure used in traditional growth process which varies between $1\times10^{-2}$ mBar to 1 Bar. Furthermore, the oxidation time may vary between seconds to 60 minutes. In such an instance, the diffused oxygen atoms of the oxygen dosage can form an oxide layer which is crystalline in nature, such as the aforementioned crystalline terminating oxide layer.

In an example, the electrical insulator layer is formed by plasma-enhanced chemical vapour deposition (PECVD) technique. Such technique is often used in semiconductor manufacturing to properly deposit films onto wafers containing metal layers or other temperature-sensitive structures. Such PECVD oxide films offer greater process flexibility and can be combined with other films including PECVD nitride and PVD metals. This PECVD oxide layer is a single sided film and can be applied to semiconductor wafers with minimal thermal processing. Such oxide layers are often employed during the semiconductor manufacturing process to form intra-metal dielectric stacks. In an example, PECVD oxide is also used in MEMS and surface micromachining processes.

In one example, the crystalline terminating oxide layer can be fabricated concurrently with fabrication of the neighbouring epitaxial semiconductor layer. Alternatively, the crystalline terminating oxide layer can be fabricated prior to fabrication of the neighbouring epitaxial semiconductor layer. Furthermore, when forming the crystalline terminating oxide layer, the employed oxygen distribution is varied, spatially. Such a variation is optionally implemented as two or more different crystal phases, where each of the crystal phase or phases is monitored by employing a suitable instrument, such as low energy electron diffraction (LEED), reflection high energy electron diffraction (RHEED) or reflectance anisotropy spectroscopy (RAS). In an example, the oxygen distribution in a vertical direction, relative to a plane of the aforesaid external surface, for fabrication of the terminating oxide layer, can be controlled, for example, by implementing epitaxial growth concurrently while performing surface oxidation and also whilst varying the aforementioned oxygen dosage. The formed crystalline terminating oxide layer is uniform in its lateral dimensions relative to a plane of the aforesaid external surface of the semiconductor substrate.

According to an embodiment, the crystalline terminating oxide layer is formed by absorbing an oxygen dosage into the preceding layer to transform the surface of the first semiconductor layer to a terminating oxide layer. The oxygen dosage (which can also be called oxygen dose and oxygen flux) is dependent on size and material of the semiconductor substrate. The oxygen dosage is selected to be low enough such that oxygen atoms of the oxygen dosage can adsorb and diffuse into the first semiconductor material without creating an amorphous surface structure on the external surface. It will be appreciated that a too high dose of oxygen atoms will create an amorphous surface structure on the external surface. Similarly, a too high dosage will create an amorphous surface structure on the external surface. In one example, the oxygen dosage employed for fabrication of the present crystalline terminating oxide layer is less than 100000 Langmuir, where Langmuir is a unit of exposure (or dosage) to a surface (e.g. of a crystal) to measure the adsorption of gases. In such an instance, the crystalline terminating oxide layer can have a thickness of 2 nm or less. Optionally, a thicker terminating oxide layer of more than 2 nm may be formed, by alternating epitaxial growth and oxidation, or by implementing epitaxial growth concurrently while implementing oxidation. Furthermore, the crystalline terminating oxide layer may comprise crystal defects i.e. amorphous regions or other crystalline structures, but preferably most of the layer comprises said crystalline structure.

According to an embodiment, the semiconductor surface and/or the oxygen atoms is/are illuminated with UV light before, during and/or after the forming of the corresponding crystalline terminating oxide layer. In other words, forming of the corresponding crystalline terminating oxide layer comprises illuminating the first III-V compound semiconductor surface and/or the oxygen atoms with UV light. Most typically, illumination with UV light is used during the forming of the corresponding crystalline terminating oxide layer, but it may also be used before (typically immediately before) and/or after the forming of this layer. It is also possible to use UV light only before and during, only before and after or only during and after the forming. The UV light can thus be used immediately prior to the use of the oxygen, during use of the oxygen or immediately after the use of oxygen. Most typically, illumination with UV light is used during the forming of the corresponding crystalline terminating oxide layer, but it may also be used before (typically immediately before) and/or after the forming of this layer. It is also possible to use UV light only before and during, only before and after or only during and after the forming. Similarly, the UV-light may be directed to the oxygen flow or to the surface to be treated, or both.

By utilizing ultraviolet (UV) light, it is possible to alter the parameter space where the corresponding crystalline terminating oxide layer can be formed, i.e. to modify the required temperature, time and/or dosage of oxygen needed. Typically, the formation of corresponding crystalline terminating oxide layer needs an elevated temperature. In some embodiments the required temperature for forming a corresponding crystalline terminating oxide layer can be lowered by irradiating the oxygen atoms and/or the III-V compound semiconductor with UV light prior, during and/or after the absorption of oxygen atoms onto the III-V compound semiconductor surface.

Indeed, without wishing to be bound by a theory, the inventors believe that the crystalline structure may, immediately upon forming, be a non-organised structure. Thereafter, with the effect of UV light, the crystalline structure is organised to the desired structure. A benefit of lowering the required temperature is that during manufacturing of a semiconductor device, increased temperature required for the formation of a layer may have a negative effect on a previously formed layer. This negative effect can be avoided or at least minimised by the use of UV-light when it allows decreasing the processing temperature.

The luminosity of the UV light used may be 20 mW/cm$^2$-1500 mW/cm$^2$. For example the luminosity can be from 20, 50, 100, 150, 200, 250, 300, 350, 400, 450, 500, 550, 600, 650, 700, 750, 800, 850, 900, 1000, 1050, 1100, 1150, 1200, 1250 or 1300 mW/cm$^2$ up to 50, 100, 150, 200, 250, 300, 350, 400, 450, 500, 550, 600, 650, 700, 750, 800, 850, 900, 950, 1000, 1050, 1100, 1150, 1200, 1250, 1300, 1350, 1400, 1450 or 1500 mW/cm$^2$. The duration of the use of UV light can be as long as the duration of the absorption of the oxygen atoms, it may shorter or longer than this time period.

The UV light may be provided with any suitable light source, as is known in the art. The UV light may for example have a wavelength shorter than 315 nm, or shorter than 280 nm. The UV light may have a wavelength between 100 nm and 400 nm. Indeed, the wavelength may be from 100, 110, 130, 150, 170, 200, 215, 230, 250, 265, 280, 300, 315, 330, 350 or 360 nm up to 110, 130, 150, 170, 200, 215, 230, 250, 265, 280, 300, 315, 330, 350, 360, 380 or 400 nm.

The required conditions (wavelength, time, luminosity) may vary from one III-V compound to another. Some concrete examples are given below in the experimental section, and a person skilled in the art is readily able to find out suitable conditions, based on a few simple tests.

According to an embodiment, the crystalline terminating oxide layer comprises hydrogen. Furthermore, according to an embodiment, the crystalline terminating oxide layer comprises nitrogen. In another embodiment, indium atoms are deposited onto the first semiconductor layer prior to transforming the surface to a crystalline terminating oxide layer. In another embodiment, tin atoms are deposited onto the first semiconductor layer prior to transforming the surface to a crystalline terminating oxide layer. In yet a further embodiment both indium and tin atoms are deposited onto the first semiconductor layer prior to transforming the surface to a crystalline terminating oxide layer.

In the present description, the resultant crystalline terminating oxide layer has a crystal structure with a long range ordering of atoms. In practice, a first lattice structure at and close to surface of the first semiconductor layer transforms due to adsorbed oxygen atoms. Therefore, the formed crystalline terminating oxide layer contains oxygen and atoms of the III-V compound. Since the amount of oxygen atoms is within predetermined range and those are administered in a control manner, the oxygen atoms will find themselves within a unit cell of semiconductor lattice at an adsorption site, and thus the formed oxygen termination layer will have a crystal structure. Typically, the crystalline terminating oxide layer is a few atomic layers thick, for example, up to around substantially 3 nm thick, but can go up to a few hundred atomic layers thick. In an embodiment, the crystalline terminating oxide layer is a crystalline compound semiconductor oxide.

In the semiconductor device, the electrically insulating layer is grown on top of the crystalline terminating oxide layer. The electrically insulating layer (also sometimes simply referred to as "insulator") may be separated from the semiconductor layer by the crystalline terminating oxide layer. In an embodiment, the growth of the electrically insulating layer can be achieved using known methods in the art, such as, but not limited to, atomic layer deposition (ALD). In an example, a series of growth processes are optionally employed for growing the electrically insulating layer; for example, first, a few nanometres of insulator material can be grown with atomic layer deposition and then a thicker layer of a same insulator material or some other insulator material can be grown thereupon with any method known in the art.

In an embodiment, the method of fabricating the semiconductor device may involve using wafer bonding techniques. It may be appreciated that wafer bonding techniques are useful for incorporating different materials into a single semiconductor chip. For example, a structure of GaAs-on-insulator bonded to silicon, having a $Y_2O_3$ crystalline oxide separating GaAs and Si can be feasibly fabricated using wafer bonding techniques. It will be appreciated by a person skilled in the art that for use of crystalline terminating oxide layers for improving surface states, it may not be necessary to use such rare element as Yttrium to form a bonding interface, as required in conventional processes.

According to an embodiment, the method of fabricating the semiconductor device further comprises cutting away, etching or cleaving the substrate from the semiconductor device during fabrication of the semiconductor device. Specifically, the substrate onto which the semiconductor device is fabricated is cut away or cleaved from the semiconductor device during fabrication of the semiconductor device. Usually, the substrate layer is removed from the semiconductor device after it has been grown as desired, unless the substrate layer can also act as an insulator for the XOI structure based semiconductor device of the present disclosure. The cutting of the substrate layer, for example semiconductor wafer, is optionally performed by employing suitable cutting methods, such as, but not limited to, laser cutting, cleaving, precision cutting and abrading process. In laser cutting, a cutting point is selected based on the stack structure and an application for an eventual semiconductor device that is being thereby fabricated. The cutting is optionally executed in non-oxidizing conditions, such as in a vacuum environment or in an inert gas ambient environment. Such precautions are taken to prevent the oxidation of newly formed surfaces generated as a result of such cutting, which are ready to be transformed into crystalline terminating oxide layers. The semiconductor wafer can then undergo further processing, including one or more oxidation treatments, material deposition, etching and metal contact formation. The removed substrate layer can optionally be reused in a next process, acting as a platform for compound semiconductor growth.

In an embodiment, the semiconductor device is a heterostructure device with layers or regions of dissimilar crystalline semiconductors, for example, but not limited to, semiconducting materials having unequal band gaps. In one embodiment, the semiconductor device comprises multiple semiconductor layers disposed between a first crystalline terminating oxide layer and a second crystalline terminating oxide layer.

According to an embodiment, the method of fabricating the semiconductor device comprises arranging at least one further semiconductor layer on the semiconductor layer, before arranging the second crystalline terminating oxide layer. Alternatively, the method comprises arranging at least one further III-V compound semiconductor layer on the substrate before arranging the first crystalline terminating oxide layer. According to an embodiment, the semiconductor device thus comprises further semiconductor layers between the first crystalline terminating oxide layer and the second crystalline terminating oxide layer. In such a case, the method comprises obtaining the substrate layer and arranging at least one further III-V compound semiconductor layer on the substrate layer. Subsequently, the first crystalline terminating oxide layer is arranged on the at least one further III-V compound semiconductor layer. Notably, the at least one III-V compound semiconductor layer is arranged on the first crystalline terminating oxide layer.

Subsequently, the second crystalline terminating oxide layer is arranged on the at least one III-V compound semiconductor layer and the electrical insulating layer is arranged on the second crystalline terminating oxide layer. Therefore, the semiconductor device comprises a plurality of layers in the following order:
- a substrate layer;
- at least one further III-V compound semiconductor layer;
- a first crystalline terminating oxide layer;
- at least one III-V compound semiconductor layer;
- a second crystalline terminating oxide layer;
- an electrical insulating layer.

In embodiments of the present disclosure, the semiconductor device is fabricated as a heterostructure by using epitaxial fabrication processes. According to an embodiment, the at least one of the plurality of semiconductor layer interfaces via its crystalline terminating oxide layer to a neighbouring epitaxial semiconductor layer thereto. Furthermore, according to an embodiment, the semiconductor device of the present disclosure includes a wafer-bonded element therein. The crystallinity of such semiconductor device can be improved by utilizing a crystalline oxide termination layer as a platform for epitaxial regrowth onto the aforesaid crystalline oxide termination layer. Specifically, it is feasible to improve the crystal quality of semiconductor structures in applications where semiconductor regrowth is necessary, by employing epitaxial growth of layers onto crystalline terminating oxide layer structures.

Additionally, known epitaxial growth methods used to manufacture the heterostructures include, but are not limited to, metal-organic chemical vapour deposition (MOCVD) and molecular beam epitaxy (MBE). Such techniques for manufacturing semiconductor devices are well known in the art, and have not been described herein in detail for the brevity of the present disclosure. By performing such epitaxial growth and oxidation simultaneously according to the present description, it is feasible to create a thicker layer of crystalline terminating oxide than what is achievable by merely utilizing oxidation of an epitaxial semiconductor surface. In such embodiments, there is provided a benefit of the creation of oxygen containing epitaxial structures which are resistant to further oxygen exposure, and on which it is possible to grow epitaxial material.

In an example, based upon use of III-V semiconductor heterostructures, it is necessary to implement epitaxial layer growth after executing processing. Examples of processing methods may include, etching, but are not limited thereto. Furthermore, generated etched surfaces may be typically of lower quality than an initial corresponding surface, due to uneven etching of the surface, residual etchant molecules or oxygen induced disorder. Such disorder and worsened quality of the surface is harmful to semiconductor regrowth. In the present semiconductor device, the crystalline terminating oxide layers are optionally used as an etch stop layer. When embodiments of the present disclosure are employed, namely use of a crystalline terminating oxide layer, such layer is beneficial to facilitate subsequent semiconductor regrowth, for example via epitaxial deposition.

According to an embodiment, the semiconductor device can be implemented as a Field Effect Transistor (FET), wherein the conduction path is coupled between source and drain electrodes of the FET, and a gate electrode of the FET is operable to define the applied electric field. Furthermore, the semiconductor device may be implemented as at least one of: a laser diode device stack, a semiconductor light emitting diode (LED) stack, a semiconductor photodetector stack, a semiconductor solar cell stack. Moreover, the semiconductor devices of the present disclosure can be employed in various types of optoelectronic devices, including, but not limited to, amplifiers, light emitting diodes and edge emitting and surface emitting lasers that incorporate optical feedback to provide lasing action, and may have further applications in solid state lighting, solid state displays, lasers, light emitting diodes (LEDs), biomedical therapy and diagnostic devices, medical lasers, eye surgery devices and DVD lasers.

According to an embodiment, when manufacturing or fabricating the semiconductor device of the present description, comprising three semiconductor layers, the method further comprises absorbing an oxygen dosage into a surface of a second semiconductor layer to form at least one corresponding crystalline terminating oxide layer; and growing a third semiconductor layer onto a top of the formed at least one crystalline terminating oxide layer of the second semiconductor layer. The obtained semiconductor device thus comprises a third semiconductor layer having a third material structure and an interface between the second semiconductor layer and the third semiconductor layer which consists of at least one corresponding crystalline terminating oxide layer of the second semiconductor layer. The first and second semiconductor layers are typically different from one another, and the third semiconductor layer may be the same as either the first or second semiconductor layer, or it may be different from both of them. Similarly, the crystalline structures of the first, second and optional third material structures may be mutually lattice-matched or mutually non-lattice matched. Alternatively, two of the material structures may be mutually lattice-matched while the remaining one is non-lattice matched, or vice versa.

DESCRIPTION OF THE DRAWINGS

Referring to FIG. 1, there is shown a schematic illustration of a cross-section of a semiconductor device 200, in accordance with an embodiment of the present disclosure. As shown, the semiconductor device 200 includes an electrical insulating layer 202 (simply referred to as "INS" in the drawings). In this embodiment, the semiconductor device 200 includes multiple crystalline terminating oxide layers (referred to as "CTOL" in the drawings) therein. Specifically, the semiconductor device 200 includes a second crystalline terminating oxide layer 204. Thereafter, the semiconductor device 200 includes at least one III-V compound semiconductor layer 206 that may be a compound semiconductor substrate material (referred to as "CS" in the drawings) and is in contact with the second crystalline terminating oxide layer 204 from one of its sides. Furthermore, the semiconductor device 200 includes an additional first crystalline terminating oxide layer 208, such that the III-V compound semiconductor layer 206 from other of its sides is in contact therewith.

Figure 2A:
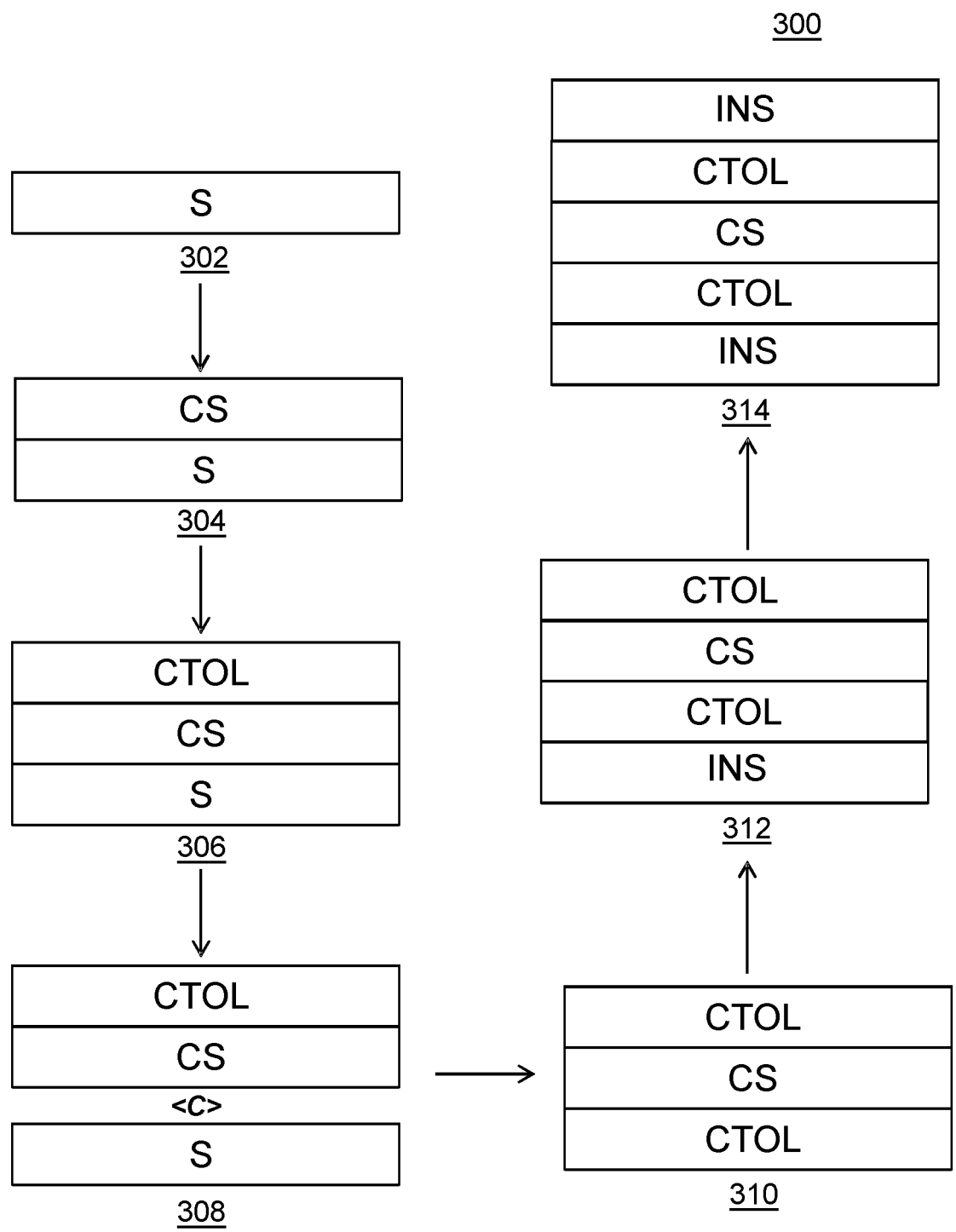
FIG. 2A is an illustration of steps of a method of fabricating the semiconductor device, in accordance with an embodiment of the present disclosure.

Referring to FIG. 2A, there is shown an illustration of steps of a method 300 of fabricating the semiconductor device in accordance with an embodiment of the present disclosure. At a step 302, a substrate layer is provided, referred to by "S" in the drawings. At a step 304, a compound semiconductor layer, such as the III-V compound semiconductor layer 206, is grown epitaxially on one of the surfaces of the substrate layer, for example by employing epitaxial gaseous deposition processes. At a step 306, a first crystalline terminating oxide layer, such as the crystalline terminating oxide layer 204, is manufactured by transforming the compound semiconductor layer by oxidation treatment of an exposed surface thereof. At a step 308, the substrate layer is cleaved or cut-off from the given structure, for example by way of a cleaving, precision cutting or abrading process. This is illustrated by the symbol <C> in the Figures. At a step 310, an additional second crystalline terminating oxide layer, such as the crystalline terminating oxide layer 208, is provided by oxidation of the compound semiconductor layer; optionally, after rotating or flipping the given structure, so that the compound semiconductor layer is surrounded at its two major faces by crystalline terminating oxide layers. At a step 312, an electrical insulating layer is grown on top of the first crystalline terminating oxide layer in the given structure. Optionally, at a step 314, a second electrical insulating layer is grown on top of the second crystalline terminating oxide layer in the given structure, to complete the XOI based semiconductor device of the present disclosure.

Figure 2B:
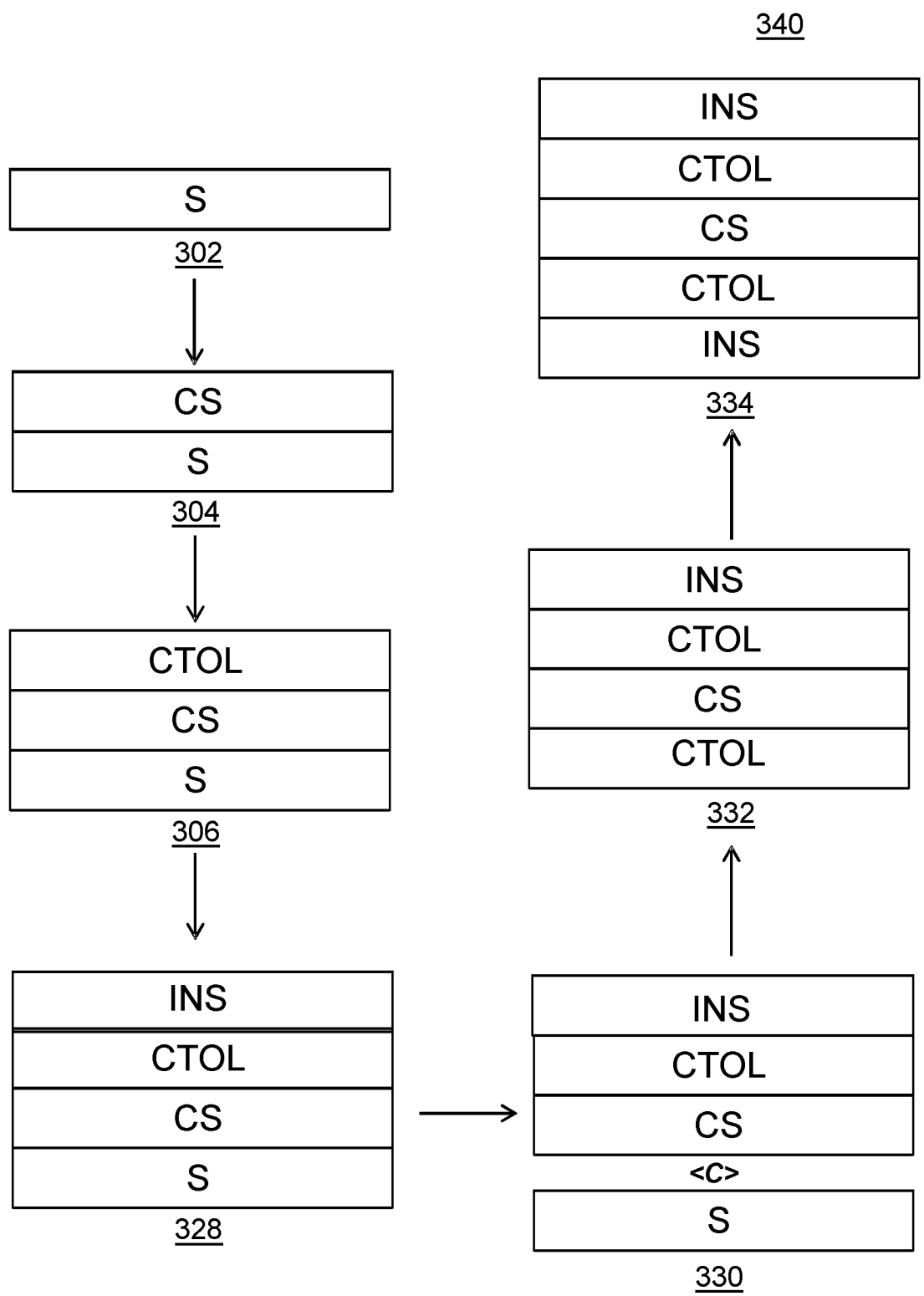
FIG. 2B is an illustration of steps of a method of fabricating the semiconductor device, in accordance with another embodiment of the present disclosure.

Referring to FIG. 2B, there is shown an illustration of steps of a method 340 of fabricating the semiconductor device, in accordance with another embodiment of the present disclosure. At a step 302, a substrate layer is provided. At a step 304, a compound semiconductor layer, such as the semiconductor layer 206, is grown epitaxially on one of the surfaces of the substrate layer, for example by employing epitaxial gaseous deposition processes. At a step 306, a first crystalline terminating oxide layer, such as the crystalline terminating oxide layer 204, is manufactured by transforming the III-V compound semiconductor layer by oxidation treatment of an exposed surface thereof. At a step 328, an insulator layer is grown on top of the crystalline terminating oxide layer. At a step 330, the substrate layer is cleaved or cut-off from the given structure, for example by way of a cleaving, precision cutting or abrading process. At a step 332, an additional second crystalline terminating oxide layer, such as the crystalline terminating oxide layer 208, is provided by oxidation of the compound semiconductor layer. Finally, at a step 334, a second electrical insulating layer is grown on top of the second crystalline terminating oxide layer in the given structure, to complete the XOI based semiconductor device of the present disclosure.

Figure 3A:
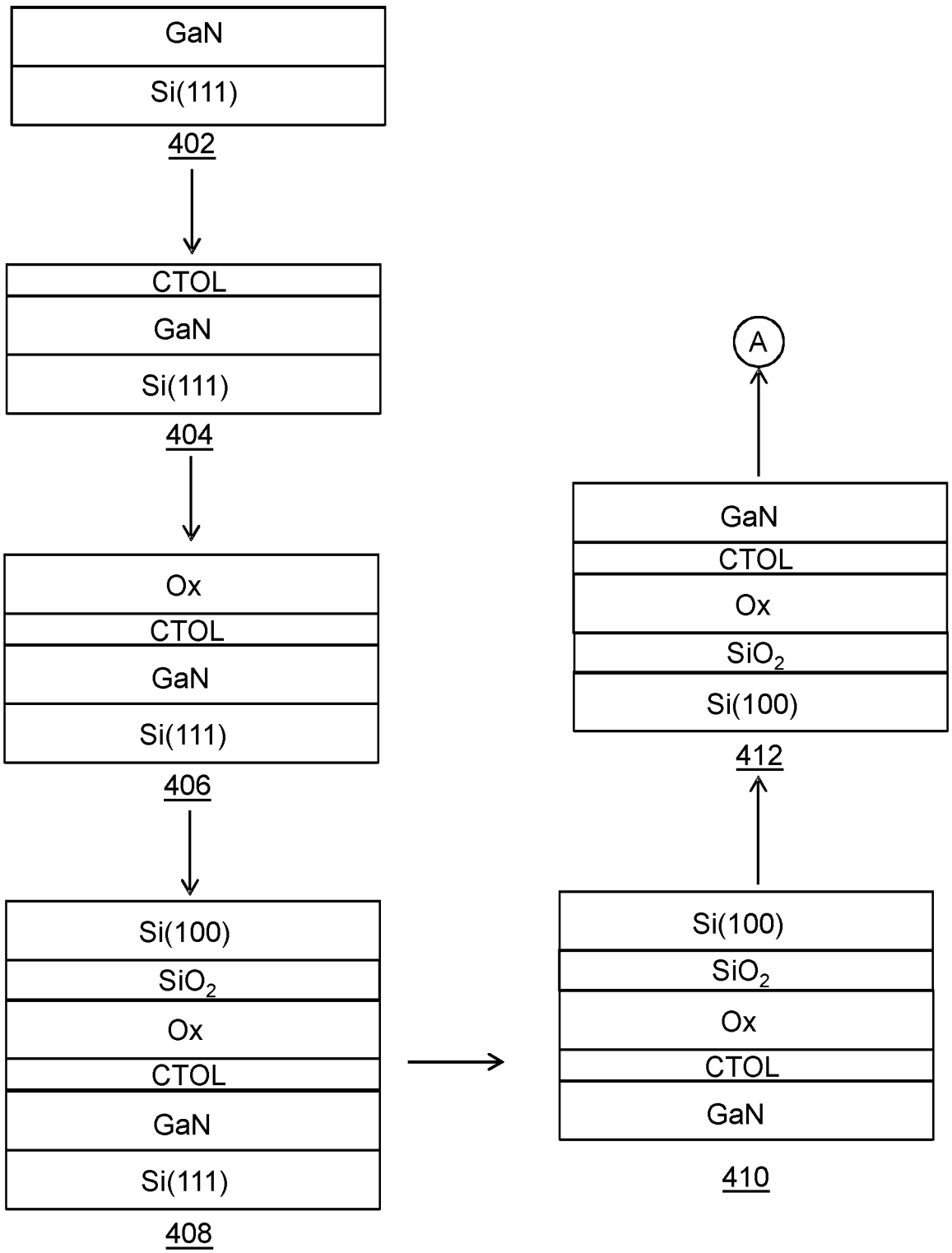
FIG. 3A-B is an illustration of steps of a method of fabricating the semiconductor device, in accordance with another embodiment of the present disclosure.
Figure 3B:
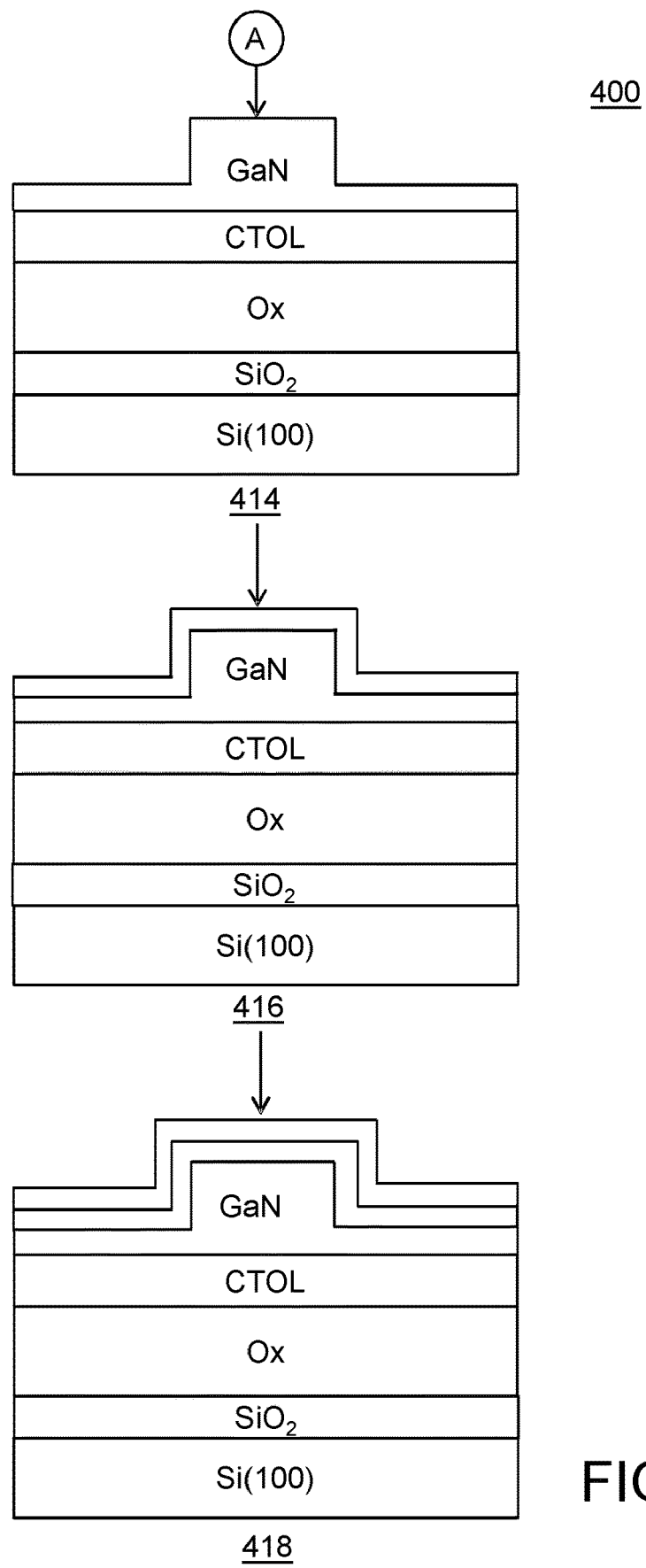

Referring to FIGS. 3A-B, there is shown an illustration of steps of a method 400 of fabricating the semiconductor device, in accordance with an embodiment of the present disclosure. The method 400 comprises fabricating the semiconductor device to include a wafer-bonded element therein. The method 400 has been explained in terms of fabrication of a semiconductor device with gallium nitride (GaN) as compound semiconductor substrate and silicon (Si(111)) as substrate layer. At a step 402, a substrate layer of Si or $SiO_2$ is provided with a III-V compound semiconductor layer of GaN grown epitaxially on one of the surfaces thereof, is provided. At a step 404, a first crystalline terminating oxide layer is formed by transforming the III-V compound semiconductor layer by oxidation treatment of an exposed surface thereof. At a step 406, an oxide layer is grown on the first crystalline terminating oxide layer, illustrated by "Ox" in the Figures. In an embodiment, the aforementioned oxide layer is formed by plasma-enhanced chemical vapour deposition (PECVD) technique. At a step 408, a wafer layer formed of silicon (Si) and silicon-dioxide ($SiO_2$), which acts as an electrical insulating layer, such as electrical insulating layer 202, is bonded on the oxide layer. Beneficially, the wafer bonding technique is employed to create a GaN-on-insulator structure. At a step 410, the substrate layer is etched, cleaved or cut-off from the given structure, for example by way of a cleaving, precision cutting or abrading process. At a step 412, the given structure is flipped upside down. The steps of method 400 of fabricating the semiconductor device then continues from FIG. 3A to FIG. 3B, by way of a flowchart connector A. At a step 414, the III-V compound semiconductor layer of GaN is selectively etched as per the required configuration of the semiconductor device to be fabricated. At a step 416, a second crystalline terminating oxide layer is formed on the etched III-V compound semiconductor layer by oxidation treatment. Optionally, at a step 418, such second electrical insulator layer is grown as per the required configuration of the semiconductor device to be fabricated.

A practical implementation of the above methods 300, 400 is described herein in terms of fabricating an InP based XOI structure. First, an InP substrate is received. This substrate is then chemically treated to remove contaminants such as carbon from an external surface of the substrate, for example wafer. The wafer is then inserted into a processing chamber, where a heterostructure containing a high electron mobility transistor (HEMT) structure is grown with MOCVD onto the wafer. The substrate surface is then transformed into a crystalline terminating oxide layer using oxidation treatment. A 6 nm thick $HfO_2$ insulation layer is then grown on top of the crystalline terminating oxide lair by employing atomic layer deposition (ALD) process. Then, a 500 micrometre thick $SiO_2$ layer is then grown on $HfO_2$ layer by employing chemical vapour deposition (CVD) process. The wafer is then cut by employing laser to separate the original substrate, namely wafer, from the heterostructure that is formed in above steps. The cutting is completed under vacuum conditions. A piece containing the heterostructure is then further processed, for example transforming the newly formed surface to a second crystalline terminating oxide layer, depositing a second $HfO_2$ layer and depositing a second $SiO_2$ layer, and then mounted into a header and then electrode wires are attached to provide a functional device. The further processing includes etching and metal contact deposition.

Figure 4A:
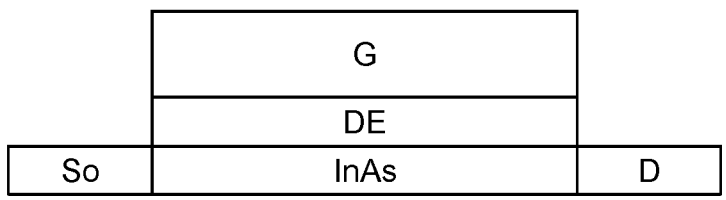
FIG. 4A is a schematic illustration of a cross-section of a conventional semiconductor device with application as a Field Effect Transistor (FET)

Referring to FIG. 4A, there is shown a schematic illustration of a cross section of a conventional semiconductor device 502 with application as a Field Effect Transistor (FET) As shown, the conventional semiconductor device 502 includes a III-V compound semiconductor layer InAs, a source (So), a drain (D), a gate (G) and a dielectric (DE).

Figure 4B:
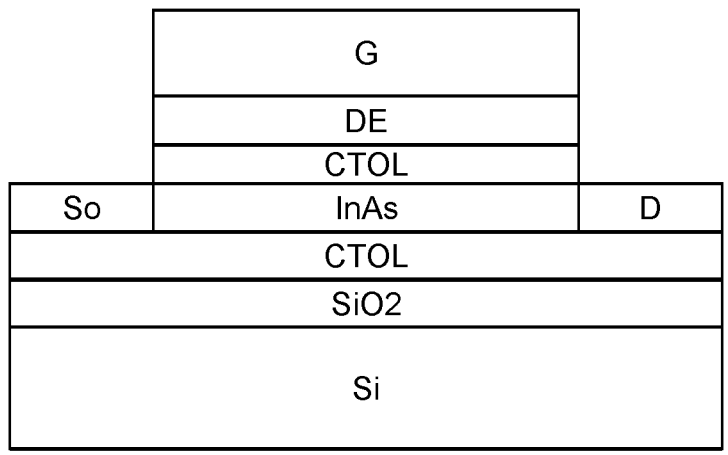
FIG. 4B is a schematic illustration of a cross-section of a semiconductor device with application as a Field Effect Transistor (FET), in accordance with an exemplary embodiment of the present disclosure.
Figure 4C:
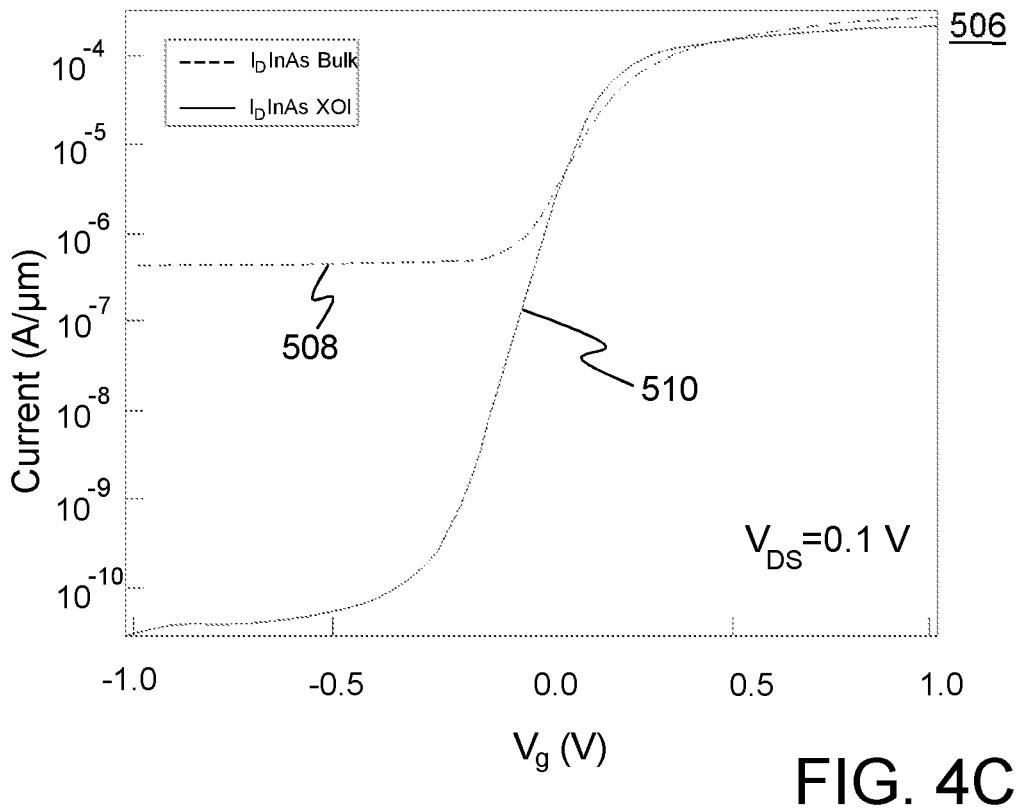
FIG. 4C is an illustration of a plot showing I-V curve for the conventional semiconductor device of FIG. 4A and semiconductor device of FIG. 4B, in accordance with the exemplary embodiment of the present disclosure.

Referring to FIG. 4B, there is shown a schematic illustration of cross-section of a semiconductor device 504 with application as a Field Effect Transistor (FET), in accordance with an exemplary embodiment of the present disclosure. As shown in FIG. 4B, the semiconductor device 504 includes a crystalline terminating oxide layer between InAs and $SiO_2$ layers therein. It will be appreciated that such XOI based semiconductor device 504 can be fabricated using the methods 300, 400 of the present disclosure, described above. Referring to FIG. 4C, there is shown a plot 506 showing I-V curve for the conventional semiconductor device 502 of FIG. 4A and semiconductor device 504 of FIG. 4B, in accordance with the exemplary embodiment of the present disclosure. In the plot 506, '$V_{DS}$' represents a voltage between drain and source electrodes. Furthermore, the curve 508 represents an I-V curve of the conventional semiconductor device 502 of FIG. 4A and the curve 510 represents an I-V curve of the semiconductor device 504 of FIG. 4B. It may be interpreted from the plot 506 that the crystalline terminating oxide layer in the semiconductor device 504 is operable to result in reduced leakage currents for XOI FETs, in comparison with the conventional semiconductor device 502.

Figure 5:
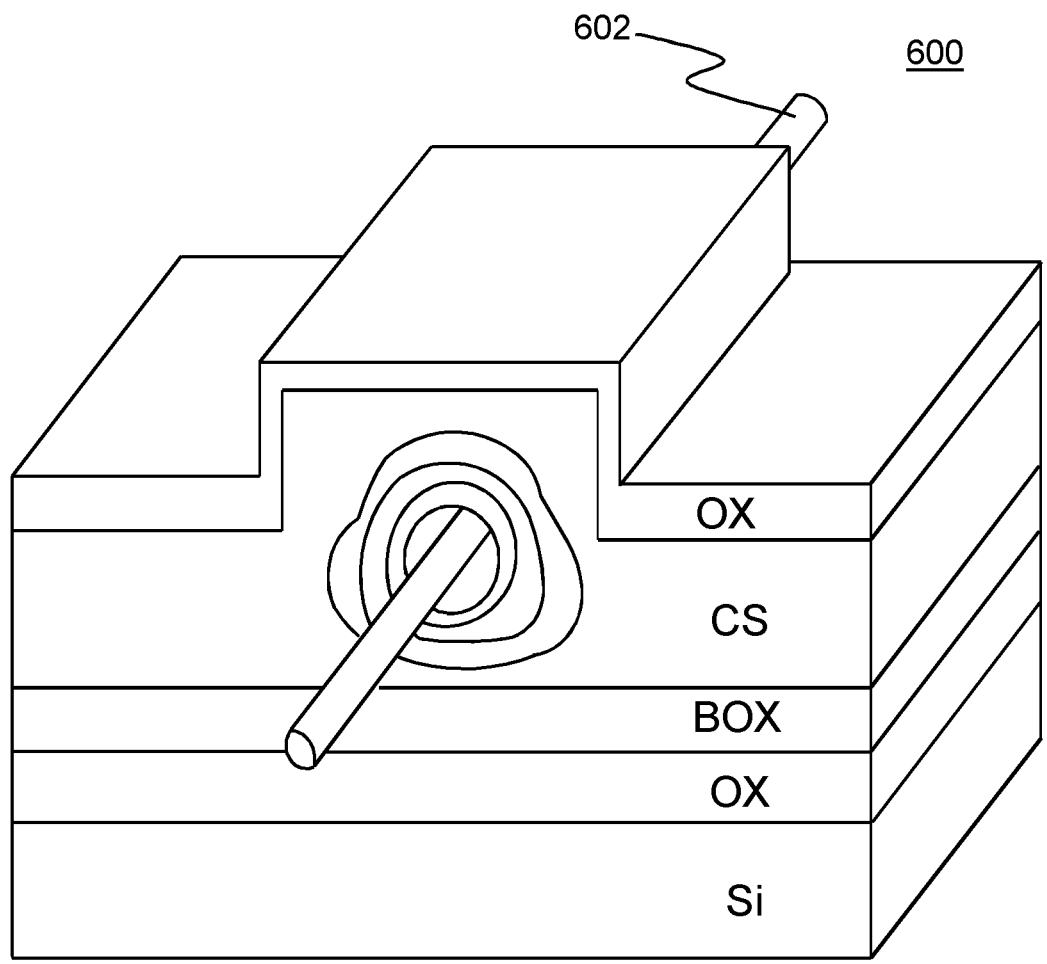
FIG. 5 is a schematic illustration of a semiconductor device with application as a photonics device, in accordance with an embodiment of the present disclosure.

Referring to FIG. 5, illustrated is a schematic illustration of a semiconductor device 600 with application in photonic devices, in accordance with an embodiment of the present disclosure. The semiconductor device 600 provides a XOI based structure; and further includes oxide layers (OX) and a buried crystalline terminating oxide layer (BOX) interfaces. Photonic crystal waveguides (PCW) are basic elements for building integrated optical circuits. They carry the light to and from the functional part of the photonic crystal structure e.g., filter or resonator. The lower the losses in the PCW, the better the performance of the photonic crystal structure with the specific functionality. As may be seen from FIG. 5, the semiconductor device 600 of the present disclosure can guide light (e.g., a light ray 602, as shown) through semiconductor layer due to the buried crystalline terminating oxide layer therein, enabling the device to be used in photonic applications.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

The invention claimed is:

1. A method of fabricating a semiconductor device comprising a plurality of layers, the method comprising:
   obtaining a substrate layer;
   arranging at least one III-V compound semiconductor layer on the substrate layer;
   arranging a first corresponding crystalline terminating oxide layer on the at least one III-V compound semiconductor layer;
   arranging a first electrical insulating layer on the first corresponding crystalline terminating oxide layer;
   cutting away, cleaving or etching the substrate layer;
   arranging a second corresponding crystalline terminating oxide layer on the at least one III-V compound semiconductor layer; and
   arranging a second electrical insulating layer on the second corresponding crystalline terminating oxide layer, wherein
   arranging the corresponding crystalline terminating oxide layers is carried out by heating an external surface of the semiconductor layer in vacuum conditions with a chamber background pressure in range of $1\times10^{-11}$ to $1\times10^{-7}$ mBar and at a temperature of at least 200° C. and up to 550° C., by exposing the external surface to a dosage of oxygen atoms at the selected temperature by having an oxygen gas with partial pressure of less than $1\times10^{-7}$ to $1\times10^{-2}$ mBar in a vacuum chamber;
   arranging the electrical insulating layers is carried out by atomic layer deposition;
   and wherein a surface symmetry of the crystalline terminating oxide layers is
   ($2\times3$) or ($1\times1$) when the III-V compound semiconductor layer is InP,
   c($4\times2$) and ($3\times1$) or ($3\times1$) or ($3\times3$) when the III-V compound semiconductor layer is InAs,
   c($4\times2$), ($4\times3$), ($3\times1$) and ($3\times2$) or ($3\times1$) or ($3\times3$) when the III-V compound semiconductor layer is InGaAs,
   ($3\sqrt{3}\times3\sqrt{3}$–R30°) when the III-V compound semiconductor layer is GaN,
   ($1\times1$) when the III-V compound semiconductor layer is AlGaN or InGaP,
   ($1\times2$) when the III-V compound semiconductor layer is InSb or InGaSb.

2. A method of claim 1, further comprising fabricating the semiconductor device as a heterostructure by using epitaxial fabrication processes.

3. A method of claim 1, wherein the crystalline terminating oxide layers are formed by absorbing an oxygen dosage into a preceding layer to transform a surface of the semiconductor layer to a terminating oxide layer.

4. A method of claim 1, further comprising depositing indium and/or tin atoms onto before absorbing an oxygen dosage into a surface of the semiconductor layer.

5. A method according to claim 1, further comprising illuminating a surface of the semiconductor layer with UV light during the forming of the corresponding crystalline terminating oxide layers.

6. A method of claim 1, wherein the at least one semiconductor layer is operable to provide a conduction path for an electrical signal, and the conduction path has charge carriers whose density in operation is controlled by an applied electric field.

7. A method of claim 1, wherein the crystalline terminating oxide layers are implemented as a buried layer.

8. A method of claim 1, wherein the semiconductor device is implemented as a Field Effect Transistor, wherein the conduction path is coupled between source and drain electrodes of the Field Effect Transistor, and a gate electrode of the Field Effect Transistor is operable to define an applied electric field.

9. A method of claim 1, wherein the semiconductor device is implemented as a compound semiconductor on insulator structure.

10. A method of claim 1, wherein the semiconductor device includes a wafer-bonded element therein.

11. A method of claim 1, wherein the crystalline terminating oxide layers comprise hydrogen and/or nitrogen.

12. A method of claim 1, wherein the crystalline terminating oxide layers are a crystalline compound semiconductor oxide layer.

13. A computer program product comprising a non-transitory computer-readable storage medium having computer-readable instructions stored thereon, the computer-readable instructions being executable by a computerized device comprising processing hardware to execute the method as claimed in claim 1.

* * * * *